United States Patent [19]
Fitzgerald et al.

[11] Patent Number: 6,014,033
[45] Date of Patent: Jan. 11, 2000

[54] METHOD OF IDENTIFYING THE POINT AT WHICH AN INTEGRATED CIRCUIT FAILS A FUNCTIONAL TEST

[75] Inventors: Glenn R. Fitzgerald, Garland; Eric G. Moore, Richardson; Randy L. Williams, Denison, all of Tex.

[73] Assignee: Texas Instruments Incorporated, Dallas, Tex.

[21] Appl. No.: 08/697,662

[22] Filed: Aug. 28, 1996

Related U.S. Application Data

[60] Provisional application No. 60/003,019, Aug. 31, 1995.

[51] Int. Cl.[7] .................................................. G01R 31/26
[52] U.S. Cl. .......................................................... 324/765
[58] Field of Search ................................. 324/765, 158.1, 324/754, 755

[56] References Cited

U.S. PATENT DOCUMENTS

| | | | |
|---|---|---|---|
| 2,794,952 | 6/1957 | Golden et al. | 324/765 |
| 4,769,883 | 9/1988 | Nathanson et al. | 29/25.42 |
| 4,890,270 | 12/1989 | Griffith | 368/113 |
| 5,003,256 | 3/1991 | Merrill | 371/61 |
| 5,099,196 | 3/1992 | Longwell et al. | 324/537 |
| 5,457,400 | 10/1995 | Ahmad et al. | 324/763 |
| 5,481,549 | 1/1996 | Tokuyama | 371/27 |
| 5,630,110 | 5/1997 | Mote, Jr. | 395/556 |

*Primary Examiner*—Josie Ballato
*Assistant Examiner*—Russell M. Kobert
*Attorney, Agent, or Firm*—Alan K. Stewart; Wade James Brady, III; Richard L. Donaldson

[57] ABSTRACT

A test system (10) is provided that comprises a controller (14) which controls a test head (12) which comprises a pattern sequence controller (16). An integrated circuit (20) is tested through pin cards (18a) through (18n). A test program (32) operating in controller (14) operates to perform both functional and scanning tests on the integrated circuit (20). Scanning tests are provided for set-up, hold, pulse width, and maximum frequency.

7 Claims, 4 Drawing Sheets

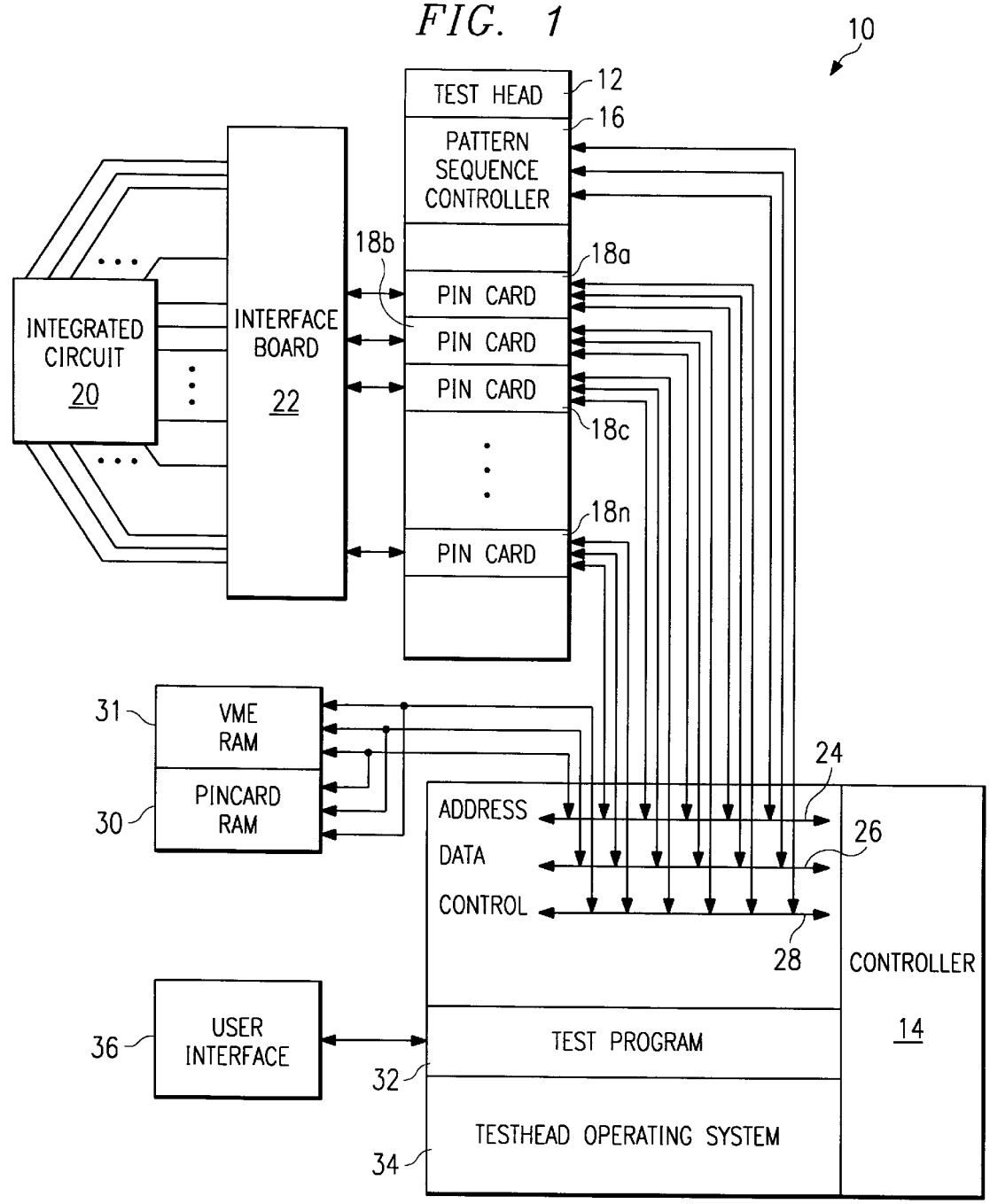

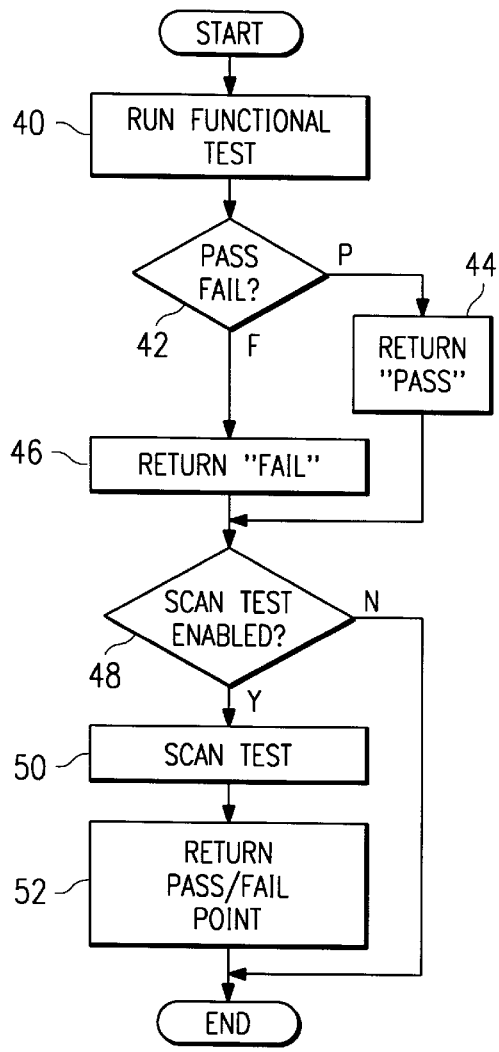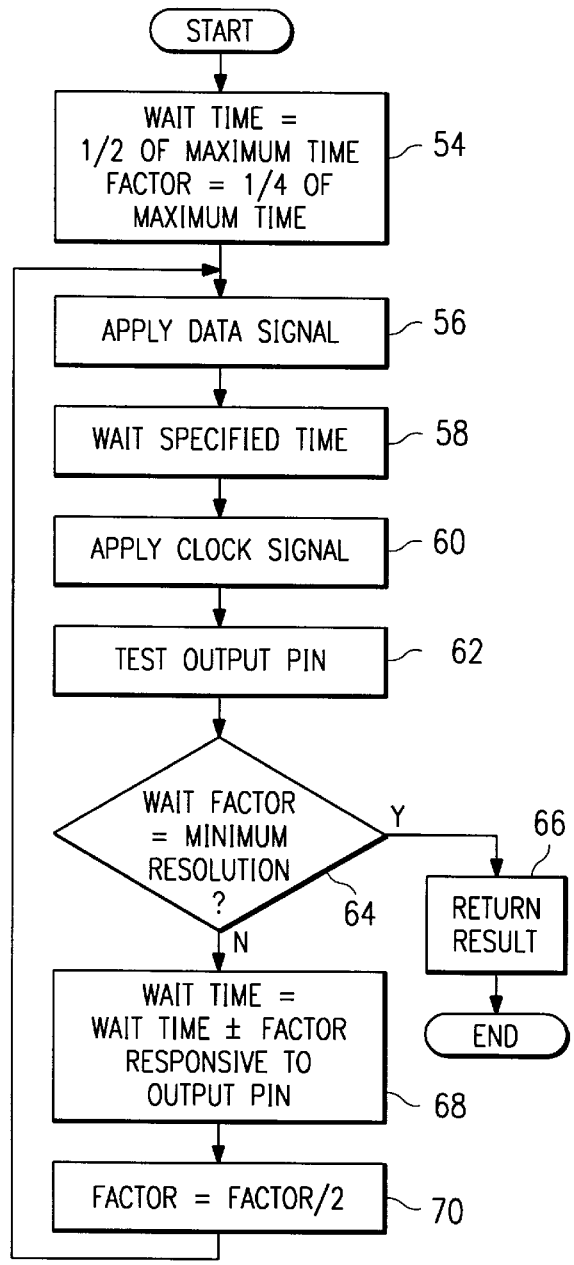

METHOD OF IDENTIFYING THE POINT AT WHICH AN INTEGRATED CIRCUIT FAILS A FUNCTIONAL TEST

This application claims priority under 35 USC § 119(e)(1) of provisional application No. 60/003,019 filed 08/31/95.

TECHNICAL FIELD OF THE INVENTION

This invention relates in general to the field of electronic systems and more particularly to an improved integrated circuit testing system and method.

BACKGROUND OF THE INVENTION

Testing systems for integrated circuit devices not only provide quality control information but also provide valuable feedback to electronic systems designers. Testing systems are used to test the DC and AC characteristics of a particular integrated circuit device. In addition, more complex tests are used to test the internal timing of the device. For example, tests such as the set-up and hold tests determine how long signals must remain in a steady state in order for other processes within the integrated circuit to function responsive to those signals. In addition, tests such as the minimum pulse width and maximum frequency tests determine how short a clock signal pulse and high a frequency of a clock signal a particular integrated circuit device may use and still function properly.

In the past, testers have performed functional tests which set a particular parameter and determined if a particular integrated circuit device passes or fails based on these parameters. These functional tests are useful in quality control in the sense that they can determine whether a particular integrated circuit will operate under particular operating conditions. However, functional tests are not as useful to provide feedback to designers because they do not determine the extent to which a particular circuit has passed or has failed.

SUMMARY OF THE INVENTION

Accordingly, a need has arisen for a testing system and method that provide information as to the point at which an integrated circuit device changes from passing to failing a particular functional test with respect to the internal timing of the integrated circuit device.

In accordance with the teachings of the present invention, an integrated circuit testing system and method are provided that substantially eliminate and reduce disadvantages and problems associated with prior art systems and methods. According to one embodiment of the present invention, a testing system is provided that comprises a test head coupled to inputs and outputs of an integrated circuit. The test head is coupled to a controller that is operable to execute a test program. The test program is operable to repeatedly execute a selected test of the integrated circuit device and to alter the parameters of the test after each successive iteration of the test in order to identify approximately the point at which the integrated circuit device fails the selected test.

BRIEF DESCRIPTION OF THE DRAWINGS

A more complete understanding of the advantages of the present invention may be acquired by referring to the accompanying FIGUREs wherein:

FIG. 1 is a schematic block diagram of a testing system constructed according to the teachings of the present invention;

FIG. 2 is a flow chart of a combined functional test and scan test testing method of the present invention;

FIG. 3 is a flow chart representation of a set-up scan test according to the teachings of the present invention;

DETAILED DESCRIPTION OF THE INVENTION

Figure 4:
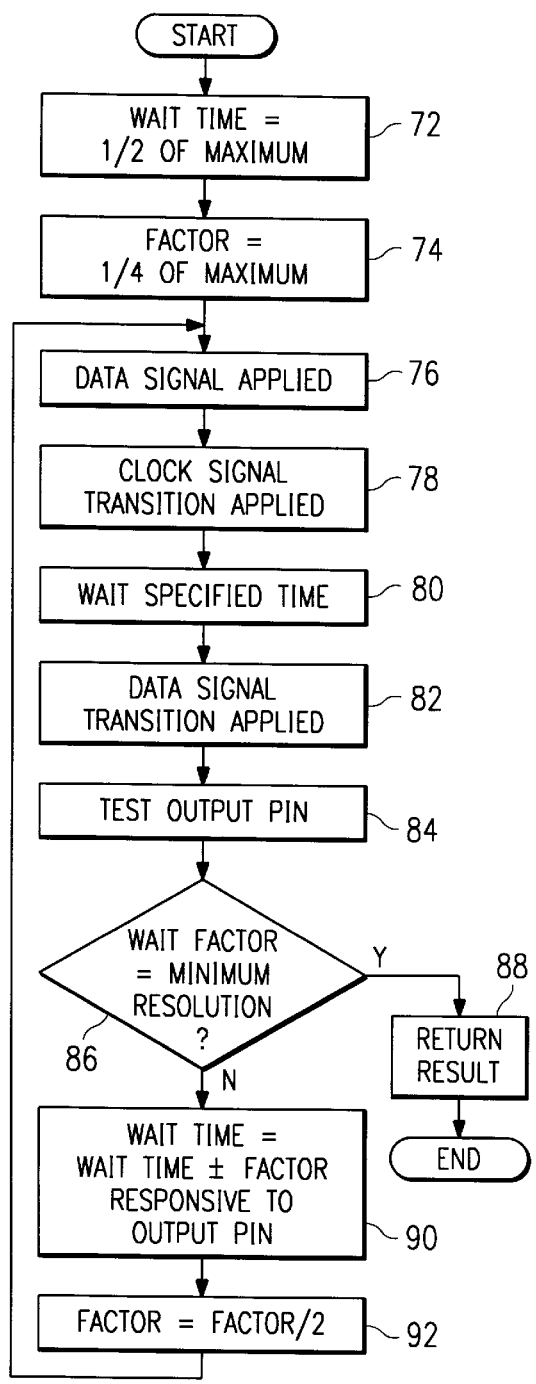
FIG. 4 is a flow chart representation of a hold scan test performed according to the method of the present invention.

FIG. 1 illustrates a testing system indicated generally at 10 which comprises a test head 12 which is connected to a controller 14. Test head 12 comprises a pattern sequence controller 16. Test head 12 also comprises a plurality of pin cards 18a through 18n. Pin cards 18a through 18n interface with an integrated circuit chip 20 through an interface board 22. Each active input and output of integrated circuit 20 is coupled to a separate pin card 18 through the interface board 22. Interface board 22 provides conditioning of the signals passed through the pin cards 18 and the inputs and outputs of integrated circuit 20. The pin cards 18 and the pattern sequence controller 16 are coupled to an address bus 24, a data bus 26 and a control bus 28 within controller 14 as shown in FIG. 1.

The address data and control busses 24, 26 and 28 are also coupled to pin card random access memory 30 and VME random access memory 31 which are used to store program information and data information for programs executed by the controller 14. The pin card RAM 30 is resident on each pin card 18. The VME RAM 31 is resident in controller 14. Both RAM 30 and 31 are accessible via busses 24, 26 and 28.

The controller 14 executes a test program 32 which uses functions and facilities within a test head operating system 34 within controller 14. A user interface 36 allows a user to interact with the controller 14 through the test program 32. The user interface 36 may comprise a conventional terminal comprising a display and keyboard.

In general, the test program 32 operating within controller 14 accesses the pattern sequence controller 16 and pin cards 18 within test head 12 to instruct the pattern sequence controller 16 to execute particular patterns of signals which are used to exercise the inputs and outputs of the integrated circuit 20. For example, pin card 18a might be instructed to output a pulse to a particular pin on integrated circuit 20. Pin card 18c may then be instructed to monitor a particular pin on integrated circuit 20 for an expected output resulting from the signal sent by pin card 18a. The operations of the pin cards 18a through 18n are performed extremely quickly under the control of the pattern sequence controller 16 in order to test the timing of the integrated circuit 20. As will be discussed herein, often the patterns executed by the pattern sequence controller 16 will involve the activation of an input signal in close proximity to a clock signal and then the monitoring of an expected output signal. The pattern sequence controller 16 and the pin cards 18a through 18n are accessed through the address bus 24 and the data bus 26 and the control bus 28. The instructions sent to the pattern sequence controller 16 and the pin cards 18a through 18n are conventional memory map instructions. The test program 32 will instruct the pattern sequence controller 16 to execute a particular pattern. The test program 32 will then transfer control of the operation to the pattern sequence controller which will execute the pattern and store the results of the pattern within pin card random access memory 30 through the address and data busses 24 and 26. When the particular pattern has been executed, the pattern sequence controller will generate an interrupt within control bus 28 which will transfer control to the test program 32. The test program 32 will then retrieve and interpret the results of the pattern stored within pin card random access memory 30. As will be shown, the testing method of the present invention involves the repeated execution of patterns of signals sent to the integrated circuit 20 and the subsequent interpretation of the results. These repeated tests effectively "scan" the operation of the integrated circuit to determine the approximate point at which the integrated circuit 20 fails the particular test being performed.

FIG. 2 is a flow chart which illustrates the method of the present invention through which a conventional functional test may be incorporated into a test program with a subsequent scanning test. Referring to FIG. 2, the method begins at step 40 where test program 32 instructs the pattern sequence controller 16 to run a conventional functional test with a given set of parameters. The pattern sequence controller 16 and the pin cards 18a through 18n receive these parameters from the test program 30 and apply the required inputs and monitor the appropriate outputs of the integrated circuit The method then proceeds to step 42 where the test program 32 accesses the pin card random access memory 30 and especially the results stored therein by the pattern sequence controller 16 and the pin cards 18a through 18n to determine whether or not the functional test performed in step 40 passed or failed. If the functional test passed, the method proceeds to step 44 where an indication that the test has passed is output through the user interface 36. In contrast, if the test was not passed at step 42, the method proceeds to step 46 where the test program 42 returns a failure indication through user interface 36.

The method proceeds from either step 44 or 46 to step 48 where the test program 30 determines whether or not the scanning test has been enabled. If the scanning test has not been enabled, the method terminates. If the scanning test has been enabled, the method proceeds to step 50 where a scanning test is performed in order to determine the approximate point at which the integrated circuit 20 fails the functional test. The method then proceeds to step 52 where the test program 32 returns the point at which the pass/fail boundary was determined in the scanning test through the user interface 36. The method then terminates. FIGS. 3 through 6 illustrate several types of scanning tests which may be used independently or in the method shown in FIG. 2.

For example, FIG. 3 illustrates a method according to the teachings of the present invention for performing a scanning test to determine a set-up failure point. The set-up test measures the time between the application of a signal at a specified data input pin and the active transition at a clock pin which causes a corresponding output pin to switch in direction based on the state of the first input pin.

The method shown in FIG. 3 begins at step 54 where a wait time variable is set to one-half of a maximum time parameter. In addition, a factor variable is set to equal one-quarter of the maximum time parameter. The maximum time parameter is essentially the window in which the scanning test will search for the transition point between passing and failure of the functional test. In this case, the functional test will be the point at which the set-up time is reduced to a point where the integrated circuit 20 can no longer operate reliably.

The method proceeds from step 54 to step 56 where a data signal is applied under the control of pattern sequence controller 16 and one of the pin cards 18a through 18n. The method then proceeds to step 58 where the system waits the specified amount of time. The method then proceeds to step 60 where a clock signal is input into integrated circuit 20 using one of the pin cards 18a through 18n under the control of the pattern sequence controller 16. The method then proceeds to step 62 where an output pin is tested using one of the pin cards 18a through 18n under control of the pattern sequence controller 16. The method proceeds from step 62 to step 64 where the wait factor is compared to a minimum resolution parameter. The minimum resolution parameter may comprise, for example, 100 picoseconds. If the wait factor is equal to the minimum resolution, the method branches to step 66 where the results are stored in random access memory 30 for later retrieval by the test program 32 for presentation through the user interface 36. The method then terminates. If the wait factor is not equal to the minimum resolution in step 64, the method proceeds to step 68 where the wait time is set equal to the prior wait time plus or minus the factor variable responsive to the output pin. The method then proceeds to step 70 where the factor variable is divided by two.

The method shown in FIG. 3 performs a binary search which iteratively changes the set-up time used in the test process by either increasing or decreasing the set-up time depending upon the results of the prior iteration of the test. This has the effect of executing a binary search that identifies the minimum set-up time necessary for the particular integrated circuit 20 to function properly. The binary search continues until the factor added or subtracted from the set-up time is equal to the minimum resolution of the system. At that point, the actual minimum set-up time will be closer than the one minimum resolution from the result returned by the scanning test.

FIG. 4 illustrates a similar method of performing a scanning test to determine the minimum hold time for which the integrated circuit 20 will function properly. The hold test measures the time during which a signal is retained at one input pin after the active transition at the clock pin which causes a corresponding output pin to switch direction depending upon the state of the first input pin.

The method in FIG. 4 begins at step 72 where the initial wait time is set equal to one-half of the maximum time period. The method then proceeds to step 74 where the factor variable is set equal to one-quarter of the maximum time period. The method then proceeds to step 76 where a data signal is applied. As discussed previously, the data signal is applied through the operation of one of the pin cards 18a through 18n under control of the pattern sequence controller 16. The method then proceeds to step 78 where a clock signal is similarly applied. The method then proceeds to step 80 where the system waits for the time specified by the wait time variable. The method then proceeds to step 82 where the data signal is switched. The method then proceeds to step 84 where an output pin is tested. The method then proceeds to step 86 where the wait factor variable is compared to the minimum resolution. If the wait factor is equal to the minimum resolution, the method proceeds to step 88 where the result is returned to random access memory 30 for later access by the test program 32 and presentation through the user interface 36. The method then terminates.

If the wait factor was not equal to the minimum resolution in step 86, the step proceeds to step 90 where the wait time is set equal to the prior wait time plus or minus the factor variable responsive to the result of the test of the output pin performed in step 84 previously. The method then proceeds to step 92 where the factor variable is halved. The method then returns to step 76 where further iteration is performed.

The method shown in FIG. 4 therefore performs a similar binary search to determine minimum hold time for which the integrated circuit 20 will still function properly. This search is performed until the factor added or subtracted to the wait time is equal to the minimum resolution at which time the minimum hold time will be within one minimum resolution from the result which is returned.

Figure 5:
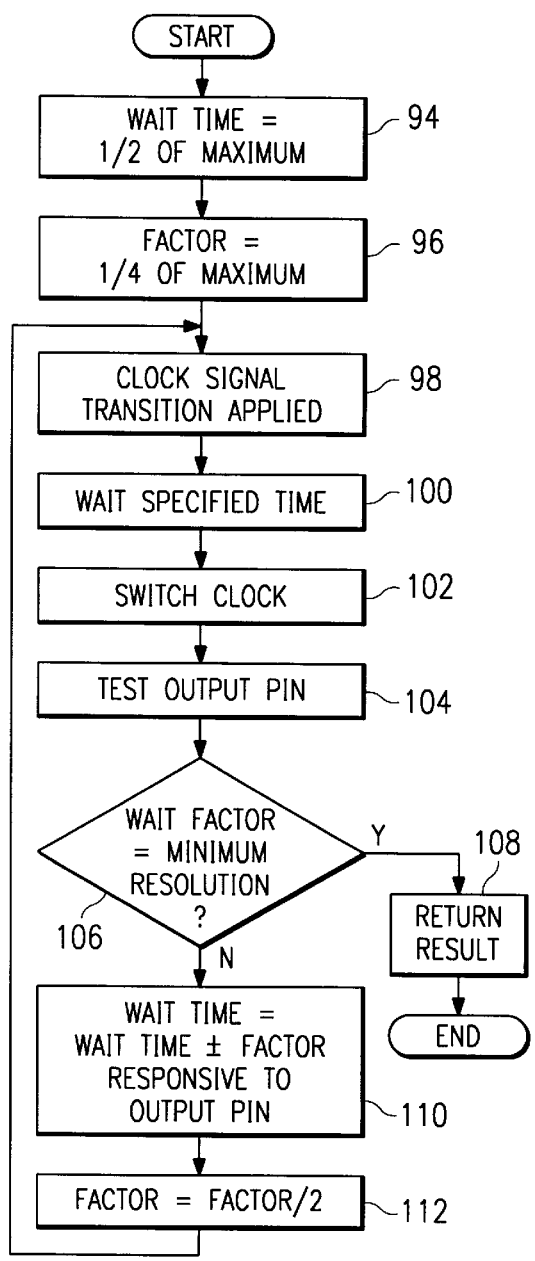
FIG. 5 is a flow chart of a pulse width scan test performed according to the method of the present invention.

FIG. 5 illustrates a similar method which searches for the minimum pulse width for which the integrated circuit 20 will function properly. The pulse width measures the minimum width from the start edge to the stop edge of a pulse on an active clock pin of the integrated circuit 20 which will cause an appropriate transition on an output pin.

Referring to FIG. 5, the method begins at step 94 where the wait time variable is set equal to one-half of the maximum time period. The method then proceeds to step 96 where the factor variable is set equal to one-quarter of the maximum time period. The method then proceeds to step 98 where a signal transition is applied to a clock pin through the operation of one of the pin cards 18a through 18n under the control of the pattern sequence controller 16. The method then proceeds to step 100 where the system waits the time specified by the wait time variable. The method then proceeds to step 102 where the clock signal is switched. The method then proceeds to step 104 where an appropriate output pin is tested by one of the pin cards 18a through 18n under control of the pattern sequence controller 16. The method then proceeds to step 106 where the wait factor is compared to the minimum resolution parameter. If the wait factor is equal to the minimum resolution, the method proceeds to step 108 where the result is placed in random access memory 30 for later retrieval by the test program 32 and presentation through the user interface 36. The method then terminates.

If the wait factor was not equal to the minimum resolution in step 106, the method proceeds to step 110 where the wait time variable is set equal to the wait time plus or minus the factor variable responsive to the result of the test of the output pin performed in step 104 discussed previously. The method then proceeds to step 112 where the factor variable is halved. The method then returns to step 98 where additional iterations of the test are performed until the minimum resolution is reached in step 106.

The method shown in FIG. 5 therefore performs a binary search which is iterated until the minimum pulse width is identified. The result returned in step 108 will be within one minimum resolution of the actual minimum pulse width.

Figure 6:
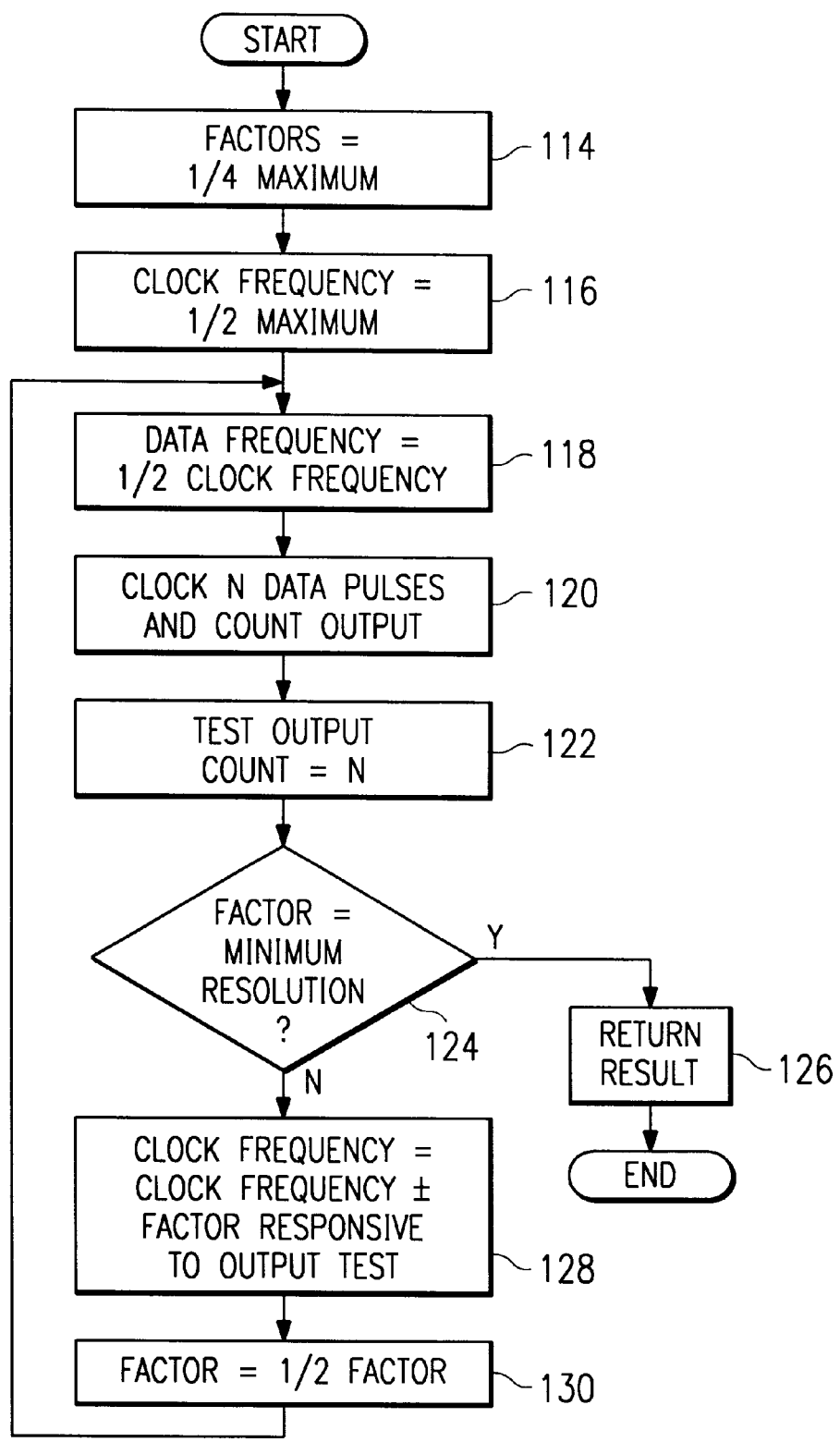
FIG. 6 is a flow chart of a maximum frequency scan test performed according to the method of the present invention.

FIG. 6 is a flowchart which illustrates a similar method which is used to identify the maximum frequency of the clock signal which may be used by the integrated circuit 20 to achieve stable transitions on an output pin. The method shown in FIG. 6 begins in step 114 where the factor variable is set equal to one-quarter of the maximum of the clock frequency. The method then proceeds to step 116 where the clock frequency is set equal to one-half of the maximum clock frequency. The method then proceeds to step 118 where the data frequency is set equal to one-half of the current value of the clock frequency. The method then proceeds to step 120 where a predetermined number of data pulses are clocked into the intergrated circuit and an output pin is monitored for the data pulses. The data pulses appearing at the output pin are then counted. The method then proceeds to step 122 where a test is performed to determine whether or not the data pulses that were counted at the output pin are correctly proportional to the number of data pulses which were clocked into the integrated circuit 20. The method then proceeds to step 124 where the factor is compared to the minimum resolution parameter. If the factor is equal to the minimum resolution, the method proceeds to step 126 where the result is returned to the random access memory 30 for later retrieval by the test program 32 and presentation through the user interface 36. If the factor is not equal to the minimum resolution in step 124, the method proceeds to step 128, where the clock frequency variable is set equal to the earlier value of the clock frequency plus or minus the factor variable responsive to the results of the test performed in step 122 discussed previously. The method then proceeds to step 130 where the factor variable is halved. The method then returns to step 118 where an additional iteration is performed.

Accordingly, the method shown in FIG. 6 will perform repeated tests by clocking in data signal transitions and testing if all of the transitions were properly processed by the integrated circuit 20 using the particular clock frequency. In this manner, the test shown in FIG. 6 will identify the maximum clock frequency for which the integrated circuit 20 will perform appropriately. The result returned by the method in FIG. 6 will be within one minimum resolution of the actual maximum clock frequency associated with the integrated circuit device 20.

Accordingly, the system and method of the present invention provides for a combination of a functional and scanning test or a stand-alone scanning test which does not merely return whether or not a device passes or fails a particular internal timing test, but rather returns the approximate point at which the device fails for each of a variety of timing tests. The point of failure of a device is much more useful than merely the information on whether or not the device passed or failed because the information can then be used to diagnose design flaws or processing flaws used to construct the device.

Although the present invention has been described in detail, it should be understood that various modifications, changes and alterations and substitutions may be made to the teachings disclosed herein without departing from the spirit and scope of the present invention which is solely defined by the appended claims.

What is claimed is:

1. A method for testing an integrated circuit comprising the steps of:

performing an operational test on an integrated circuit by providing the integrated circuit with at least one input signal and monitoring at least one output signal using at least one timing parameter;

determining whether or not the integrated circuit performed appropriately using a first value of the timing parameter; and iteratively altering the timing parameter to identify an approximate threshold value for the timing parameter at which the integrated circuit fails the functional test.

2. The method of claim 1 wherein the functional test comprises a test to measure the set-up time necessary between the application of a signal at a first input pin and the active transition of a clock pin associated with the integrated circuit to allow a corresponding output pin to alter state dependent upon the transition of the signal applied to the first input pin.

3. The method of claim 1 wherein the functional test comprises a test operable to measure a hold period measuring the time during which a signal applied to a first input pin must be held in a quiescent state following a transition of a clock pin associated with the integrated circuit to allow a corresponding output pin to alter state responsive to the state of the signal at the first input pin.

4. The method of claim 1 wherein the functional test comprises a pulse width test operable to measure the minimum width of a pulse signal on a clock pin associated with the integrated circuit device which will allow an appropriate transition on an output pin associated with the integrated circuit device.

5. The method of claim 1 wherein the functional test comprises a maximum frequency test operable to measure the maximum frequency of a signal applied to a clock pin associated with the integrated circuit device.

6. The method of claim 5 wherein the step of performing a maximum frequency test comprises the steps of:

applying a first predetermined number of clock pulses to a clock pin associated with the integrated circuit device;

applying a second predetermined number of data pulses to a data input associated with the integrated circuit device;

monitoring the transitions of an output pin associated with the integrated circuit device; and comparing the number of transitions of the output of the integrated circuit device with the second predetermined number to determine whether the frequency associated with the clock signal is above the minimum specified clock frequency for the integrated circuit device.

7. The method of claim 1 and further comprising the step of executing a functional test with a predetermined set of parameters and returning an approximate threshold value for a timing parameter at which the integrated circuit fails the functional test.

* * * * *